(12) United States Patent
Anderson et al.

(10) Patent No.: US 7,642,628 B2
(45) Date of Patent: Jan. 5, 2010

(54) MEMS PACKAGING WITH IMPROVED REACTION TO TEMPERATURE CHANGES

(75) Inventors: William T. Anderson, Chanhassen, MN (US); David Strei, Waconia, MN (US)

(73) Assignee: Rosemount Inc., Eden Prairie, MN (US)

( * ) Notice: Subject to any disclaimer, the term of this patent is extended or adjusted under 35 U.S.C. 154(b) by 284 days.

(21) Appl. No.: 11/033,076

(22) Filed: Jan. 11, 2005

(65) Prior Publication Data
US 2006/0151864 A1    Jul. 13, 2006

(51) Int. Cl.
*H01L 23/02* (2006.01)
(52) U.S. Cl. ............... 257/678; 257/786; 257/E33.058
(58) Field of Classification Search ................ 257/432, 257/704, 678, 786, E33.058; 385/18, 140
See application file for complete search history.

(56) References Cited

U.S. PATENT DOCUMENTS

| | | | |
|---|---|---|---|
| 4,152,043 A | 5/1979 | Albanese | ...................... 385/22 |
| 4,303,302 A | 12/1981 | Ramsey et al. | |
| 4,938,552 A | 7/1990 | Jebens et al. | |
| 5,080,458 A | 1/1992 | Hockaday | |
| 5,127,084 A | 6/1992 | Takahashi | |
| 5,214,727 A | 5/1993 | Carr et al. | |
| 5,226,104 A | 7/1993 | Unterleitner et al. | |
| 5,319,728 A | 6/1994 | Lu et al. | |
| 5,353,363 A | 10/1994 | Keck et al. | |
| 5,382,275 A | 1/1995 | Decao et al. | |
| 5,404,417 A | 4/1995 | Johnson et al. | |
| 5,727,099 A | 3/1998 | Harman | |
| 5,745,634 A | 4/1998 | Garrett et al. | |
| 5,862,003 A | 1/1999 | Saif et al. | |
| 5,864,643 A | 1/1999 | Pan | |
| 5,907,404 A | 5/1999 | Marron et al. | |
| 5,971,355 A * | 10/1999 | Biegelsen et al. | ...... 251/129.06 |

(Continued)

FOREIGN PATENT DOCUMENTS

JP    2003 287689    10/2003

(Continued)

OTHER PUBLICATIONS

Kim, Chunho et al., "Effects of variations in design and process parameters on assembly process yield of area array solder interconnect packages", Advanced Packaging Materials, 2002. Proceedings, 2002 8th International Symposium, p. 278-84, 2002.*

(Continued)

*Primary Examiner*—Thao X Le
*Assistant Examiner*—Ajay K. Arora
(74) *Attorney, Agent, or Firm*—Christopher R. Christenson; Westman, Champlin & Kelley, P.A.

(57) ABSTRACT

A large-scale MEMS device includes a MEMS die supported by at least one compliant die mount. The compliant die mount couples the MEMS die to a support structure. The support structure is positioned within a package. In accordance with an aspect of the invention, the package is substantially symmetrical about the MEMS die. In accordance with another aspect of the invention, the support structure and/or the package is designed to have a neutral bend axis along the MEMS die.

16 Claims, 5 Drawing Sheets

U.S. PATENT DOCUMENTS

| | | | |
|---|---|---|---|
| 6,085,016 A | 7/2000 | Espindola et al. | |
| 6,130,984 A | 10/2000 | Shen et al. | |
| 6,144,794 A | 11/2000 | Mao et al. | |
| 6,163,643 A | 12/2000 | Bergmann et al. | |
| 6,173,105 B1 | 1/2001 | Aksyuk et al. | |
| 6,173,106 B1 | 1/2001 | DeBoynton et al. | |
| 6,246,826 B1 | 6/2001 | O'Keefe et al. | |
| 6,266,474 B1 | 7/2001 | Han et al. | |
| 6,275,320 B1 | 8/2001 | Dhuler et al. | |
| 6,275,643 B1 | 8/2001 | Bandy et al. | |
| 6,311,010 B1 | 10/2001 | Medeiros | |
| 6,320,999 B1 | 11/2001 | Pouteau et al. | |
| 6,363,183 B1 | 3/2002 | Koh | |
| 6,363,203 B1 | 3/2002 | Dautartas | |
| 6,433,411 B1 | 8/2002 | Degani et al. | 257/678 |
| 6,496,351 B2 | 12/2002 | Hill et al. | 361/278 |
| 6,529,653 B1 | 3/2003 | Miller | |
| 6,538,312 B1* | 3/2003 | Peterson et al. | 257/704 |
| 6,577,793 B2 | 6/2003 | Vaganov | |
| 6,603,182 B1* | 8/2003 | Low et al. | 257/432 |
| 6,625,356 B2 | 9/2003 | Ticknor et al. | |
| 6,628,857 B1 | 9/2003 | Bonadeo et al. | 385/18 |
| 6,628,882 B2 | 9/2003 | Vaganov et al. | |
| 6,639,313 B1 | 10/2003 | Martin et al. | 257/704 |
| 6,784,536 B1* | 8/2004 | Eslamy | 257/706 |
| 6,821,819 B1* | 11/2004 | Benavides et al. | 438/122 |
| 6,895,161 B2 | 5/2005 | Romo et al. | |
| 6,949,996 B2 | 9/2005 | Matsumoto et al. | 335/78 |
| 7,197,225 B2 | 3/2007 | Romo et al. | |
| 2001/0036333 A1 | 11/2001 | Kasuga et al. | |
| 2002/0009256 A1* | 1/2002 | Chertkow et al. | 385/18 |
| 2002/0028037 A1 | 3/2002 | Steinberg et al. | |
| 2002/0031305 A1 | 3/2002 | Ticknor et al. | |
| 2002/0047768 A1* | 4/2002 | Duffy | 336/145 |
| 2002/0089044 A1* | 7/2002 | Simmons et al. | 257/668 |
| 2002/0093089 A1* | 7/2002 | Lu et al. | 257/700 |
| 2002/0097951 A1 | 7/2002 | Mortenson et al. | 385/18 |
| 2002/0141726 A1 | 10/2002 | Chan et al. | 385/140 |
| 2002/0146200 A1* | 10/2002 | Kudrle et al. | 385/18 |
| 2003/0012545 A1 | 1/2003 | Bellman et al. | 385/140 |
| 2003/0049009 A1 | 3/2003 | Vaganov et al. | |
| 2003/0133648 A1 | 7/2003 | Mitsuoka et al. | 385/22 |
| 2004/0208422 A1 | 10/2004 | Hagood et al. | 385/16 |
| 2004/0223717 A1 | 11/2004 | Romo et al. | 385/140 |
| 2004/0223718 A1 | 11/2004 | Romo et al. | 385/140 |
| 2004/0229400 A1* | 11/2004 | Chua et al. | 438/108 |

FOREIGN PATENT DOCUMENTS

| | | |
|---|---|---|
| WO | WO 02/22494 | 3/2002 |
| WO | WO 02/056096 | 7/2002 |
| WO | WO 03/058286 | 7/2003 |
| WO | WO 2004/102241 | 11/2004 |

OTHER PUBLICATIONS

International Search Report and Written Opinion from International Application PCT/US2005/043820, filed Dec. 2, 2005.

First Chinese Office Action from Appication No. 200580012356.6 filed Feb. 11, 2005.

Second Chinese Office Action from Application No. 200580012356.6 filed Feb. 11, 2005.

International Search Report issued in PCT/US2004/008772 on Aug. 19, 2004.

Written Opinion issued in PCT/US2004/008772, mailed Aug. 31, 2004.

Kan et al., "Silicon-on-insulator (SOI) movable integrated optical waveguide technology," Sensors and Actuators A, 54:679-683 (1996).

"Optomechanical Scanner," IBM Technical Disclosure Bulletin, 40:133-136 (1997).

Eng, et al., "Voltage—Controlled Micromechanical SOI Optical Waveguides," IEEE Tencom (1995) pp. 195-197, 1995.

Wood et al., "SCPFFS: A Small Cantilevered Optical Fiber Servo System," IEEE (1987).

M. Hoffmann, et al., "Lensless Latching-Type Fiber Switches Using Silicon Micromachined Actuators," 25$^{th}$ Optical Fiber Communication Conference, OFC 1000, Baltimore, Maryland, USA, Technical Digest, Thursday, Mar. 9, 2000.

P. Kopka et al., "Bistable 2×2 and Multistable 1×4 Micromechanical Fibre-optic Switches on Silicon," 3$^{rd}$ International Conference on Micro Opto Electro Mechanical Systems, MOEMS'00, Mainz, Proceedings, pp. 88-91.

Hoffmann, et al., "Optical Fibre Switches Based on Full Wafer Silicon Micromachining," J. Micromech. Microeng. 9:151-155 (1999).

Watts, et al., "Electromechanical Optical Switching and Modulation in Micromachined Silicon-on-Insulator Waveguides," IEEE 62-63 (1991).

Wu et al., "Deflecting-fiber type MEMS variable optical attenuator," Proc. SPIE 4604:61-66 (2001).

Zhang et al., "A Vertical Electrostatic Actuator with Extended Digital Range via Tailored Topology," Proc. SPIE 4700:147-156 (2002).

First Office Action from Chinese patent appication No. 200580046034.3, dated Feb. 13, 2009.

* cited by examiner

MEMS PACKAGING WITH IMPROVED REACTION TO TEMPERATURE CHANGES

BACKGROUND OF THE INVENTION

The present invention is related to packaging for MEMS devices. More particularly, the present invention is related to packaging for relatively large-scale MEMS devices where thermal expansion is problematic.

Microelectromechanical systems (MEMS) were first developed in the 1970's, and commercialized in the 1990's. Generally, MEMS devices are microscopic and are characterized by their ability to interact with the physical world on a small scale. MEMS devices can typically be categorized as either receiving some sort of mechanical input, such as sensors and the like, or devices that generate some sort of mechanical output, such as actuators. Given the extremely small scale of typical MEMS devices, such actuation may be extremely small-scale but still able to be used for a variety of purposes. Examples of MEMS sensors can be used to gather data related to thermal, optical, chemical, and even biological inputs. MEMS-based actuators can also be used for a variety of purposes, including, but not limited to, devices that respond and control the environment by moving, filtering and/or pumping materials.

While MEMS devices have traditionally been very small-scale devices (e.g. the size of a grain of sand) larger MEMS devices have also proven to be extremely useful. For example, in the field of optical communications, the movement provided by MEMS actuators can be extremely useful in providing optical switching, multiplexing and/or selective attenuation. Generally, optical MEMS devices are larger scale than the traditional microscopic structures. However, since these larger MEMS devices are electromechanical in nature, and use existing MEMS technology for fabrication, they are still considered microelectromechanical systems even though they may no longer be "micro."

Thermal expansion in MEMS devices is well known and appreciated by those skilled in the art. In fact, some MEMS devices employ thermal expansion of dissimilar materials in order to generate actuation. Since MEMS devices are generally microscopic, and since thermal expansion is proportional to the size of the body expanding, expansion of non-actuating portions of MEMS structures has traditionally not been a problem. However, in larger-scale MEMS devices, such as those used in optical communication, the MEMS structure may have a dimension that exceeds 0.5 cm. This is an extremely large-scale MEMS device. Accordingly, the thermal expansion associated with such a large device can adversely impact the mechanical aspect of the MEMS device. For example, in a variable optical attenuator, actuation on the order of micro inches may make a significant difference in optical attenuation. If additional displacement is caused by undesirable displacement due to thermal expansion, non-linearities and/or unpredictable results may occur. Accordingly, there is a desire to minimize thermal effects on large-scale MEMS devices.

Another factor that can cause undesirable displacements in large-scale MEMS devices is the packaging itself. MEMS devices are generally relatively brittle and must be protected from the environment. Accordingly, they are generally disposed within a package of some sort. Due to constraints of size and budget, the packaging material itself is generally formed of a material that is not the same as that of the MEMS structure. Thus, the packaging will generally have a coefficient of thermal expansion that differs from the MEMS material. As the temperature of the entire package/MEMS assembly changes, thermally induced strains occur. Traditional electronics packages (including MEMS packages) generally use a die mount on a single side of the device. Differing coefficients of thermal expansion (CTE) between the die and the package can cause the die to bend. Bending the die for an electronic device is generally not a significant problem since electrical connections will usually accommodate some degree of bending. However, for MEMS devices a small bend or thermally induced strain can cause the MEMS device to malfunction or not perform its intended function as well.

Providing a large-scale MEMS device with improved behavior in response to thermal changes would be extremely useful. Such devices could provide more accurate optical communication devices, such as multiplexers, switches, and attenuators, for example, without significantly increasing the cost of those devices. Further, if the temperature behavior is improved significantly, thermal control of MEMS devices and even temperature sensing of such devices may be obviated.

SUMMARY

A large-scale MEMS device includes a MEMS die supported by at least one compliant die mount. The compliant die mount couples the MEMS die to a support structure. The support structure is positioned within a package. In accordance with an aspect of the invention, the package is substantially symmetrical about the MEMS die. In accordance with another aspect of the invention, the support structure and/or the package is designed to have a neutral bend axis along the MEMS die.

DETAILED DESCRIPTION

Embodiments of the present invention are highly useful for any large-scale MEMS device for which thermal expansion can cause undesirable dimensional changes. While embodiments of the present invention will be described with respect to an electronically variable optical attenuator MEMS device, those skilled in the art will recognize that embodiments of the present invention can be practiced with many other types of MEMS devices including, but not limited to, optical communication devices such as optical switches, multiplexers as well as any other suitable MEMS devices.

Figure 1:
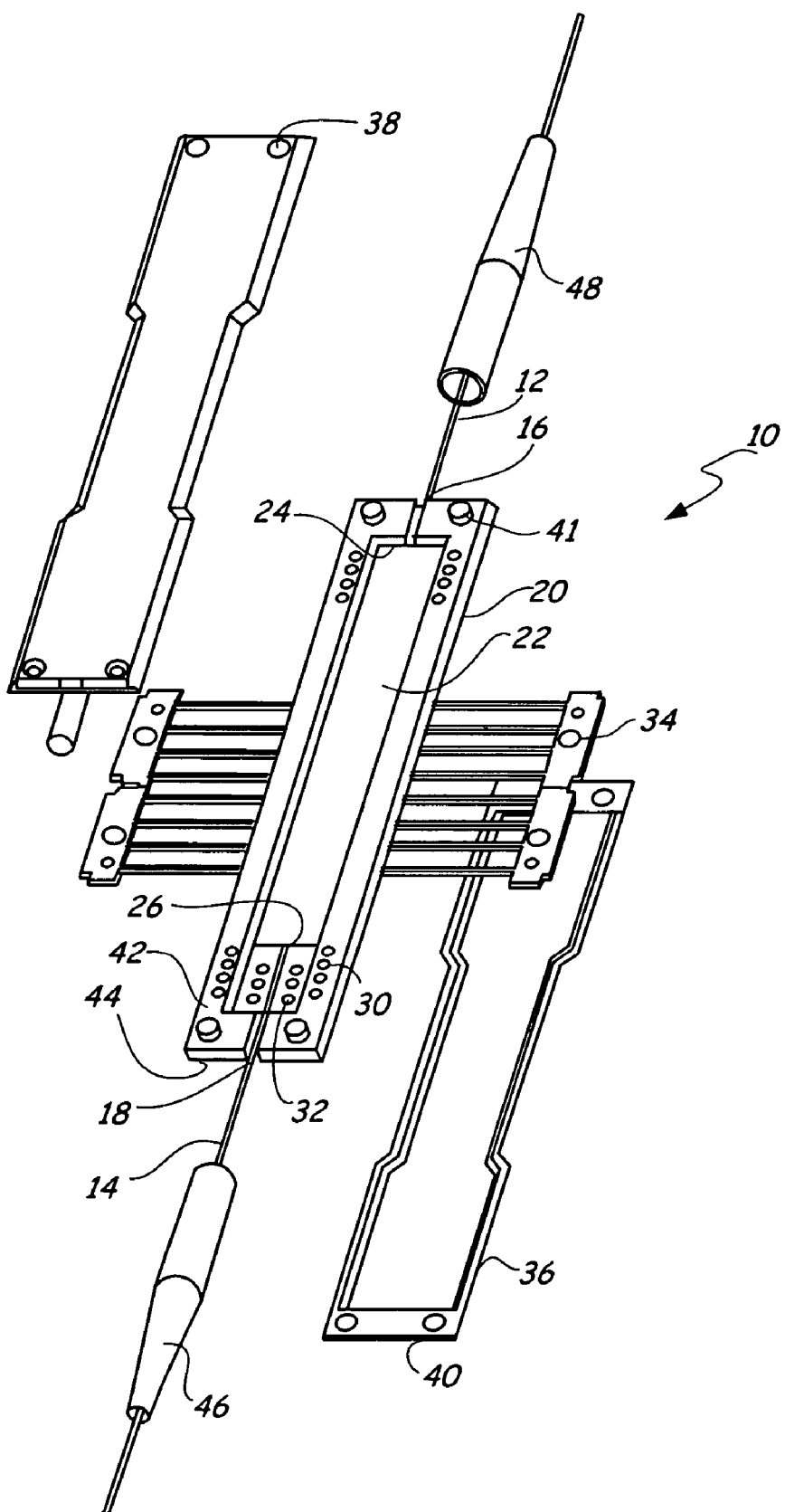
FIG. 1 is a perspective view of a MEMS structure and packaging in accordance with an embodiment of the present invention.
Figure 2:
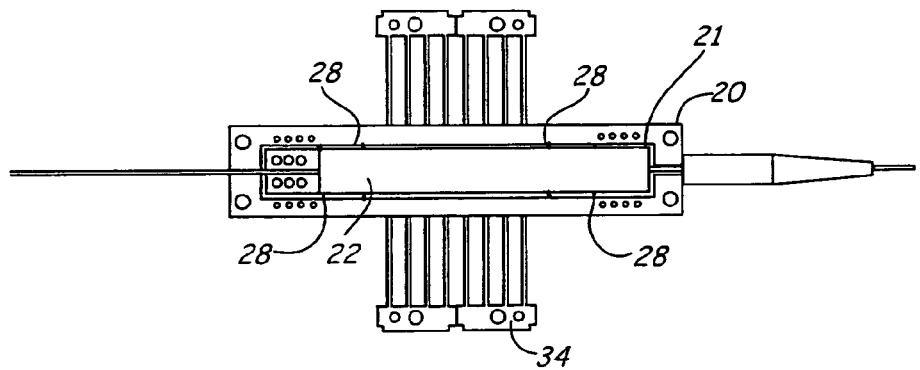
FIG. 2 is a top plan view of a MEMS die mounted within a support structure in accordance with an embodiment of the present invention.

FIG. 1 is a perspective view of an electronically variable optical attenuator based upon MEMS technology in accordance with an embodiment of the present invention. Attenuator 10 includes a pair of fiberoptic waveguides 12 and 14 that are received through slots 16 and 18, respectively, in support structure 20. Waveguides 12 and 14 are coupled to MEMS die 22 which, in accordance with known MEMS technology, provides microactuation to adjust the optical coupling between ends of waveguides 12 and 14. MEMS die 22 is a large-scale MEMS device. As used herein, large-scale MEMS device includes any MEMS structure that has a dimension that is greater than 1.0 millimeters. Additionally, a large-scale MEMS device includes traditional small-scale MEMS structures that are physically coupled to a structure having a dimension greater than 1.0 millimeters formed of a material which undergoes thermal expansion, and which expansion affects the small-scale structure. For example, the dimension between ends 24 and 26 of MEMS device 22 is preferably approximately 3 millimeters. MEMS structure 22 is preferably formed of a suitable semiconductor material, such as silicon, alumina, ceramics, etc. Generally, such materials are relatively expensive, and forming the entire device 10 out of the same material would be extremely cost prohibitive. Thus, support structure 20 is formed of a material that is different than MEMS device 22. In a preferred embodiment, support structure 20 is actually a printed circuit board using suitable printed circuit board materials. One example of such materials is the well-known FR4 epoxy laminate material used for circuit boards. FR4 has a coefficient of thermal expansion of approximately 11 microns/m/° C. lengthwise, and 15 microns/m/° C. crosswise. FR5 epoxy laminate can also be used. Accordingly, as temperature changes, MEMS die 22 changes dimensions at a rate different than that of support structure 20. In order to accommodate this differential thermal expansion, a relatively small gap is created between MEMS die 22 and support structure 20. Support structure 20 includes cavity 21 within which MEMS die 22 is disposed. FIG. 2 illustrates this gap in better detail. At least one, and preferably four, compliant die mounts are used to bridge the gap between MEMS die 22 and support structure 20. Mounts 28 are illustrated in FIG. 2. Support structure 20 preferably has a number of bonding pads 30 that are coupled to associated bonding pads 32 on MEMS die 22 using known wire bonding techniques. Electrical connection from the complete device 10 to pads 30 is facilitated by lead frame 34. Support structure 20 and each of covers 38 and 40 preferably include cooperative registration features 36 to facilitate a precise alignment of covers 38 and 40 with respect to support structure 20. In one embodiment, support structure 20 includes alignment pins extending from both top and bottom surfaces 42, 44, respectively that interact with alignment holes or recesses in covers 38 and 40. Those skilled in the art will recognize that any suitable cooperative arrangement may be employed to effect precise alignment between support structure 20 and covers 38 and 40. In some embodiments, covers 38 and 40 can, themselves, be circuit board populated with any suitable circuitry.

In order to enhance the robustness of the fiberoptic structure, a pair of strain relief boots 46 and 48 are also preferably provided for cables 14 and 12, respectively.

In accordance with one aspect of the present invention, covers 38 and 40 are substantially identical to one another. Thus, they have a substantially identical shape, are formed of substantially the same materials, and have substantially the same thicknesses as one another. Accordingly, as covers 38 and 40 are mounted to support structure 20, changes in temperature will cause equal expansions in both the covers 38 and 40 and thus will generate no, or substantially no, additional bending. While it is preferred that covers 38 and 40 be substantially identical, as long as due care is paid to each cover's contribution to bending, certain deviations can be permitted. For example, slight modifications in shape or size in one cover may be compensated by modifications in cover thickness or material in the cover. The important concept is that the relative ability of one cover to urge support structure 20 to bend in one direction as thermal expansion occurs is substantially cancelled by the opposite cover. Thus, the neutral bend axis of the entire device 10 should run substantially through the center of support structure 20 and MEMs device 22 in the plane of MEMS device 22.

FIG. 2 is a top plan view of support structure 20 supporting MEMS device 22 by virtue of compliant die mounts 28. Compliant die mounts 28 can be constructed from any suitable material that has a modulus of elasticity such that it will not impart substantially any deflection upon MEMS die 22, but will instead accommodate dimensional changes between MEMS die 22 and support structure 20. Preferably, compliant mounts 28 are constructed from an elastomeric material that has a thermal operating range suitable for the intended use of the finished device. While FIG. 2 illustrates four compliant mounts 28, it is expressly contemplated that the entire gap between die 22 and support structure 20 could be filled with a single compliant mount. Accordingly, any suitable number of compliant mounts 28, including one, may be used in accordance with embodiments of the present invention.

Figure 3:
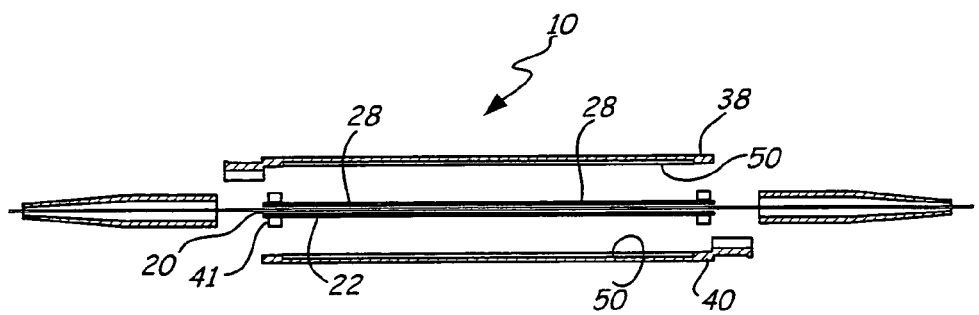
FIG. 3 is a side elevation cross section view of a MEMS die and packaging in accordance with an embodiment of the present invention.

FIG. 3 is a cross sectional elevation view of device 10 in accordance with an embodiment of the present invention. FIG. 3 illustrates top cover 38 and bottom cover 40 each having a recess 50 to increase internal space within device 10. The use of added internal space can help accommodate electronic circuitry which may be desirable to locate within device 10. FIG. 3 also illustrates compliant mounts 28 having a thickness that is substantially equal to that of support structure 20. Compliant mounts 28 have a thickness that is preferably greater than that of MEMS die 22. In some embodiments, compliant mounts 28 may be provided with a small channel or recess that envelops the edge of MEMS die 22 in order to increase the mechanical robustness of the structure. Finally, FIG. 3 illustrates alignment members 41 extending both above and below the surface of support structure 20.

Figure 4:
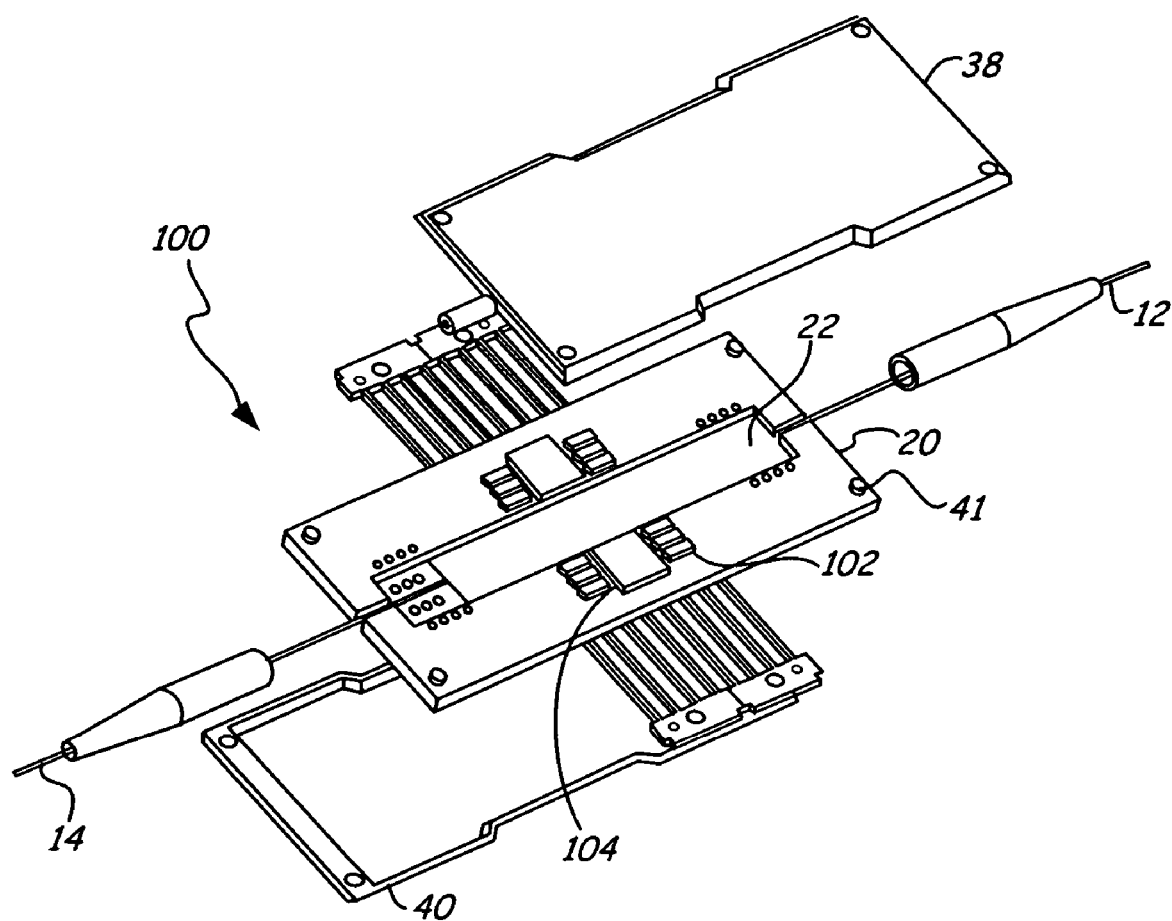
FIG. 4 is a perspective view of a MEMS die and packaging in accordance with another embodiment of the present invention.

FIG. 4 is a perspective view of an optical communication device 100 in accordance with an embodiment of the present invention. Some aspects of device 100 are similar to those of device 10, and like components are numbered similarly. The primary difference between device 100 and device 10 is that device 100 includes circuitry 104 disposed on support structure 20. Circuitry 104 is illustrated within region 102. In order to accommodate circuitry 104, support structure 20, covers 38 and 40 have been widened to provide additional surface area for circuitry 104. Providing electronics within device 100 can improve device response time as well as provide additional features and characteristics of the device. The addition of circuitry 104, which is generally surface mount circuitry such as surface mount integrated circuits, surface mount resistors, surface mount capacitors, et cetera, will affect the thermal expansion characteristics of support structure 20, it is preferred that the circuitry be applied to support structure 20 in a relatively symmetrical fashion. Accordingly, as illustrated in FIG. 4, similar circuitry 104 (similar at least in the sense of their physical dimensions) is disposed on opposite sides of MEMS die 22. Further still, it is preferred that similar circuitry also be disposed on the underside of support structure 20. As stated above, covers 38 and 40 preferably include recesses 50 that accommodate the added height of circuitry on support structure 20. Circuitry 104 can be any suitable circuitry, including but not limited to, an analog-to-digital converter, an op amp, a capacitance measuring circuit, a piezoelectric measurement circuit, a Wheatstone resistor bridge, et cetera.

Figure 5:
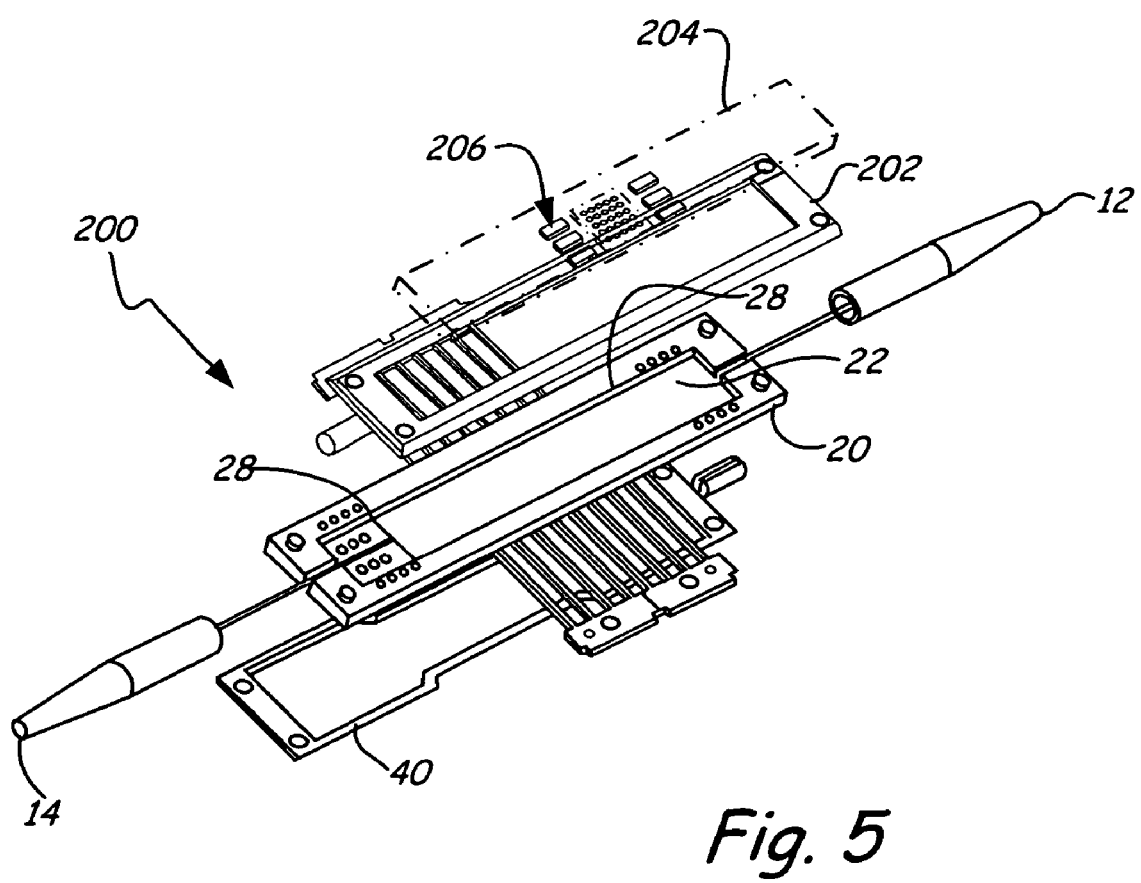
FIG. 5 is a perspective view of yet another embodiment of a MEMS die and packaging in accordance with another embodiment of the present invention.

FIG. 5 is a perspective view of a MEMS-based optical communication device 200 in accordance with another embodiment of the present invention. Device 200 bears many similarities to devices 10 and 100, and like components are numbered similarly. Device 200 illustrates another aspect of the present invention wherein one or both of the covers may also have electronic circuitry disposed thereon and/or therein. Notably, cover 202 is adapted to mount, either within or thereon, circuit board 204 having electronic circuitry 206. While it is preferred that cover 40 then be similarly configured, it is possible that embodiments of the present invention can be practiced by adapting cover 40 such that its thermal expansion characteristics counteract the combined effects of thermal expansion of cover 202 and circuit board 204.

Figure 6:
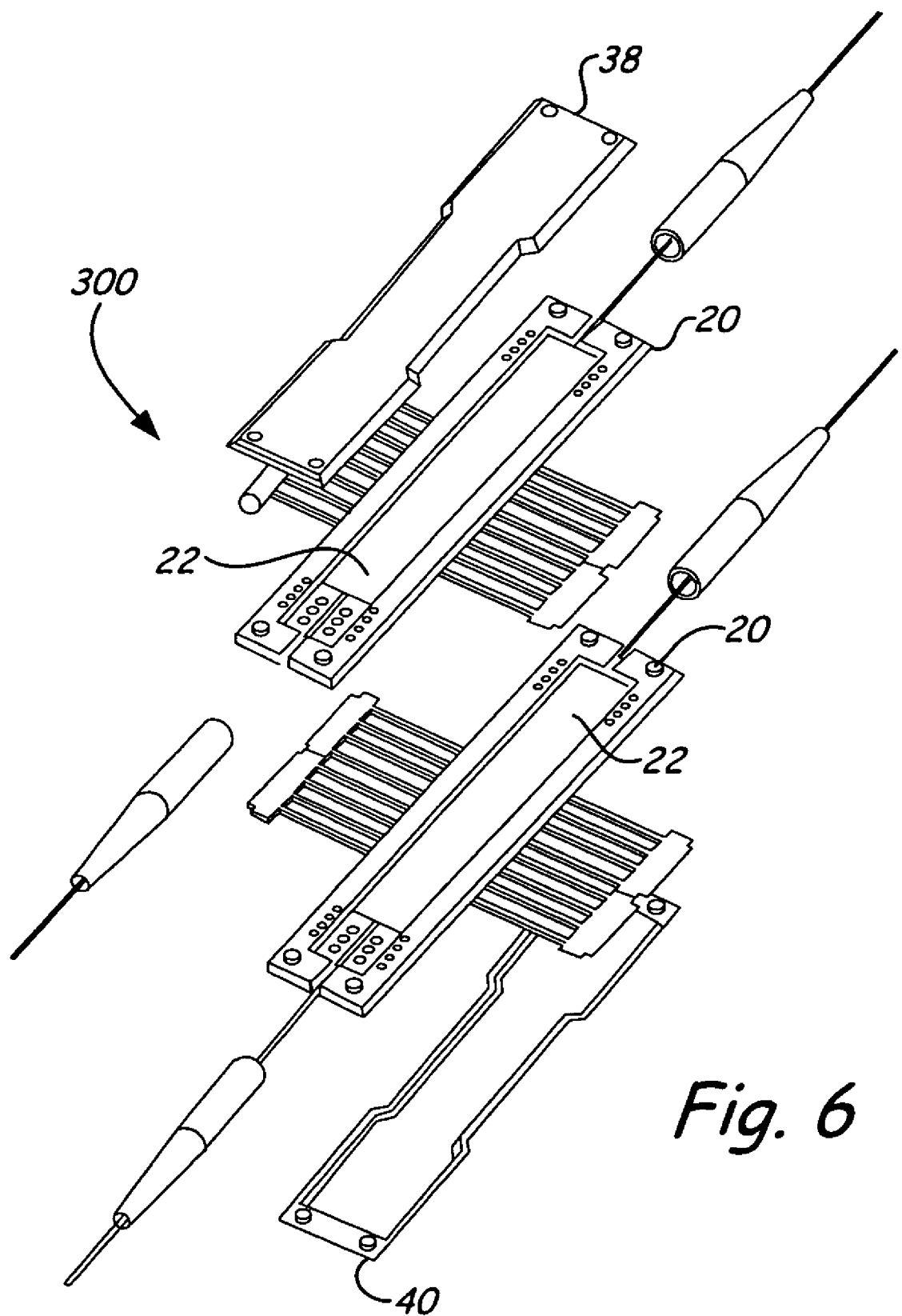
FIG. 6 is a perspective view of yet another embodiment of a MEMS die and packaging in accordance with another embodiment of the present invention.

While embodiments of the present invention have generally described a single-channel optical communication device, embodiments can also be practiced with multiple channel devices. For example, by maintaining relative symmetries, it may be possible to stack multiple MEMS devices on top of each other and enclose them within a pair of substantially identical covers. FIG. 6 is a perspective view of yet another embodiment of a MEMS die and packaging in accordance with another embodiment of the present invention. FIG. 6 illustrates large-scale MEMS device 300 having a pair of covers 38, 40 that enclose a plurality of support structures 20, each having a MEMS die 22 disposed therein. Device 300 is a multi-device in that each MEMS die 22 can be used independently. Also, Additional channels can be created in side-by-side fashion as well.

Although the present invention has been described with reference to preferred embodiments, workers skilled in the art will recognize that changes may be made in form and detail without departing from the spirit and scope of the invention. For example, While embodiments of the present invention have generally been described with respect to an electronically variable optical attenuator, those skilled in the art will recognize that embodiments of the present invention are applicable to all large-scale MEMS devices for which thermal expansion is problematic.

What is claimed is:

1. A MEMS device comprising:
   a MEMS die having a rectangular shape with at least one dimension being greater than or equal to about 1.0 mm, wherein the MEMS die has a rectangular periphery;
   a support structure having a top surface, a bottom surface, and a cavity formed between the top and bottom surfaces, the cavity defining a rectangular inner surface of the support structure that is at least substantially perpendicular to the top and bottom surfaces, wherein the rectangular inner surface of the support structure extends beyond the rectangular periphery of the MEMS die such tat the MEMS die is disposed on the rectangular inner surface of the support structure;
   a gap that extends outward from the rectangular periphery of the MEMS die to the rectangular inner surface of the support structure;
   at least one compliant mount coupled to an edge of the MEMS die and filling the entire gap, wherein the mount couples the MEMS die to the support structure; and
   a pair of covers disposed on opposite sides of the support structure.

2. The device of claim 1, wherein the pair of covers are substantially identical to each other.

3. The device of claim 1, wherein the support structure is a printed circuit board.

4. The device of claim 3, wherein the printed circuit board includes electronic circuitry.

5. The device of claim 4, wherein the electronic circuitry is positioned to reduce bending of the support structure in response to a change in temperature.

6. The device of claim 1, wherein the at least one compliant mount has a thickness that is substantially equal to a thickness of the support structure.

7. The device of claim 1, wherein at least one of the covers includes a recess.

8. The device of claim 1, wherein the MIEMS die has at least one dimension that is about 3.0 mm.

9. The device of claim 1, wherein the support structure is formed of an epoxy laminate.

10. The device of claim 9, wherein the epoxy laminate is FR4.

11. The device of claim 9, wherein the epoxy laminate is ER5.

12. The device of claim 1, and further comprising a second support structure defining a second cavity, the second cavity having a second MEMS die therein, the second MEMS die being coupled to the second support structure by at least one compliant mount.

13. The device of claim 12, wherein the first and second support structures are stacked with respect to one another.

14. The device of claim 1, wherein the device is an electronically controlled variable optical attenuator.

15. The device of claim 1, and further comprising at least one fiber-optic cable coupled to the MEMS die.

16. The device of claim 1, wherein the support structure has a plurality of bonding pads that are coupled to a plurality of bonding pads on the MEMS die.

* * * * *

UNITED STATES PATENT AND TRADEMARK OFFICE
CERTIFICATE OF CORRECTION

PATENT NO.      : 7,642,628 B2                    Page 1 of 1
APPLICATION NO. : 11/033076
DATED           : January 5, 2010
INVENTOR(S)     : Anderson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 263 days.

Signed and Sealed this

Sixteenth Day of November, 2010

David J. Kappos
*Director of the United States Patent and Trademark Office*